(12) United States Patent
Castano et al.

(10) Patent No.: US 8,415,755 B2
(45) Date of Patent: Apr. 9, 2013

(54) WHEATSTONE-BRIDGE MAGNETORESISTIVE DEVICE

(75) Inventors: Fernando J. Castano, Cambridge, MA (US); Caroline A. Ross, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1394 days.

(21) Appl. No.: 11/860,737

(22) Filed: Sep. 25, 2007

(65) Prior Publication Data

US 2008/0074224 A1    Mar. 27, 2008

Related U.S. Application Data

(60) Provisional application No. 60/846,935, filed on Sep. 25, 2006.

(51) Int. Cl.
*H01L 29/82* (2006.01)
*H01L 21/02* (2006.01)

(52) U.S. Cl. .......... 257/421; 257/295; 257/E29.323; 257/E21.665; 365/129; 365/145

(58) Field of Classification Search ............ 257/421, 257/295, E29.323, E21.665; 365/129, 145
See application file for complete search history.

(56) References Cited

U.S. PATENT DOCUMENTS

| | | | |
|---|---|---|---|
| 5,541,868 A * | 7/1996 | Prinz | 365/98 |
| 5,561,368 A | 10/1996 | Dovek et al. | |
| 5,923,583 A * | 7/1999 | Womack | 365/171 |
| 6,252,796 B1 * | 6/2001 | Lenssen et al. | 365/173 |
| 6,483,740 B1 * | 11/2002 | Spitzer et al. | 365/158 |
| 6,906,369 B2 * | 6/2005 | Ross et al. | 257/295 |
| 7,005,852 B2 * | 2/2006 | Andrei et al. | 324/252 |
| 7,593,184 B2 * | 9/2009 | Clinton et al. | 360/125.01 |
| 2004/0023064 A1 | 2/2004 | Ehresmann et al. | |
| 2004/0211996 A1 * | 10/2004 | Ross et al. | 257/295 |
| 2006/0007728 A1 * | 1/2006 | Sundstrom | 365/158 |
| 2006/0215443 A1 * | 9/2006 | Katti | 365/158 |

OTHER PUBLICATIONS

Prieto et al., "Integrated magnetic field sensor based on magnetoresistive spin valve structures," Sensors and Actuators A, 2001, pp. 64-68.
Shen, "Logic Devices and Circuits Based on Giant Magnoresistance," IEEE Transactions on Magnetics, vol. 33, No. 6, Nov. 1997, pp. 4492-4497.
Ney et al., "Programmable computing with single magnetoresistive element," 2003 Nature Publishing Group, Letters to Nature, pp. 485-487.

(Continued)

*Primary Examiner* — Matthew W Such
*Assistant Examiner* — Jeremy Joy
(74) *Attorney, Agent, or Firm* — Gesmer Updegrove LLP

(57) ABSTRACT

A magnetoresistive Wheatstone-bridge structure includes a magnetoresistive ring structure. The magnetoresistive ring structure includes a first magnetic layer comprising a ferromagnetic material. A second magnetic layer also includes a ferromagnetic material. A non-magnetic spacer is positioned between the first magnetic layer and the second magnetic layer. A vacant open region is positioned in the center region of the magnetoresistive ring structure. A plurality of magnetic states can exist in either the first magnetic layer or second magnetic layer. Furthermore, the magnetoresistive Wheatstone-bridge structure includes a plurality of voltage and current contacts arranged symmetrically upon the magnetoresistive ring structure. The magnetic state of the ring is detected by measuring its resistance.

18 Claims, 5 Drawing Sheets

OTHER PUBLICATIONS

Daughton et al., "Magnetic Field Sensors Using GMR Multilayer," IEEE Transactions on Magnetics, vol. 30 No. 6, Nov. 1994, pp. 4608-4610.

Spong et al., "Giant Magnetoresistive Spin Valve Bridge Sensor," IEEE Transactions on Magnetics, vol. 32, No. 2, Mar. 1996, pp. 366-371.

Giebeler et al., "Robust GMR Sensors for angle detection speed sensing," Sensors and Actuators A, 2001, pp. 16-20.

Saitoh et al., "Critical phenomena in magnetic vortex formation probed by noise spectroscopy" Journal of Magnesium and Magnetic Materials, Elsevier Science Publishers, Amsterdam, NL, vol. 282, Nov. 1, 2004, pp. 25-27.

Boeve et al., "Geometry Optimization of TMR Current Sensors for On-Chip IC Testing" IEEE Transactions on Magnetics, IEEE Service Center, New York, vol. 41, No. 10, Oct. 1, 2005, pp. 3685-3687.

\* cited by examiner

WHEATSTONE-BRIDGE MAGNETORESISTIVE DEVICE

PRIORITY INFORMATION

This application claims priority from provisional application Ser. No. 60/846,935 filed Sep. 25, 2006, which is incorporated herein by reference in its entirety.

BACKGROUND OF THE INVENTION

The invention relates to the field of magnetic memory devices, and in particular a magnetic memory device that can store multiple bits per ring and can be programmed to carry out different logic functions.

The Wheatstone-bridge (WB) configuration has been known for a long time. It is useful mainly in sensors, where four resistors are connected together to make a bridge circuit and a small change in one of the resistors, due to temperature, magnetic field, strain or whatever quantity is being measured, causes a big change in the resistance of the WB circuit.

SUMMARY OF THE INVENTION

According to one aspect of the invention, there is provided a magnetoresistive ring structure. The magnetoresistive ring structure includes a first magnetic layer comprising a ferromagnetic material. A second magnetic layer also includes a ferromagnetic material. A non-magnetic spacer is positioned between the first magnetic layer and the second magnetic layer. A vacant open region is positioned in the center region of the magnetic ring structure. A plurality of magnetic states can exist in either the first magnetic layer or second magnetic layer. The magnetic state of the ring can be detected by measuring its resistance.

According to another aspect of the invention, there is provided a method of forming a magnetoresistive ring structure. The method includes forming a first magnetic layer comprising a ferromagnetic material and forming a second magnetic layer also comprising a ferromagnetic material. Also, the method includes forming a non-magnetic spacer being positioned between the first magnetic layer and the second magnetic layer. A vacant open region is positioned in the center region of the magnetic ring structure. A plurality of magnetic states can exist in either the first magnetic layer or second magnetic layer. The magnetic state of the ring can be detected by measuring its resistance.

According to another aspect of the invention, there is provided a magnetoresistive Wheatstone-bridge structure. The magnetoresistive Wheatstone-bridge structure includes a magnetoresistive ring structure. The magnetoresistive ring structure includes a first magnetic layer comprising a ferromagnetic material. A second magnetic layer also includes a ferromagnetic material. A non-magnetic spacer is positioned between the first magnetic layer and the second magnetic layer. A vacant open region is positioned in the center region of the magnetic ring structure. Furthermore, the magnetoresistive Wheatstone-bridge structure includes a plurality of voltage and current contacts arranged on the magnetic ring structure such that the voltage measured across the ring depends sensitively on the magnetic state of the ring. A plurality of magnetic states can exist in either the first magnetic layer or second magnetic layer. The magnetic state of the ring can be detected by measuring its resistance.

DETAILED DESCRIPTION OF THE INVENTION

The invention provides a Wheatstone-bridge (WB) circuit having a single magnetic multilayer ring with four electrical contacts. The difference between the commonly-known WB circuit and the invention is that a commonly-known WB circuit contains four discrete resistors whereas the invention contains a single magnetic multilayer ring with four electrical contacts. The behavior of the single magnetic multilayer ring bears no relation to the behavior of four discrete magnetic multilayer resistors connected into a conventional WB circuit, because a ring acts as a single magnetic entity that can have special magnetization states such as vortex and onion states, or states containing 360 degree domain walls, related specifically to its ring-shaped geometry.

Figure 1:
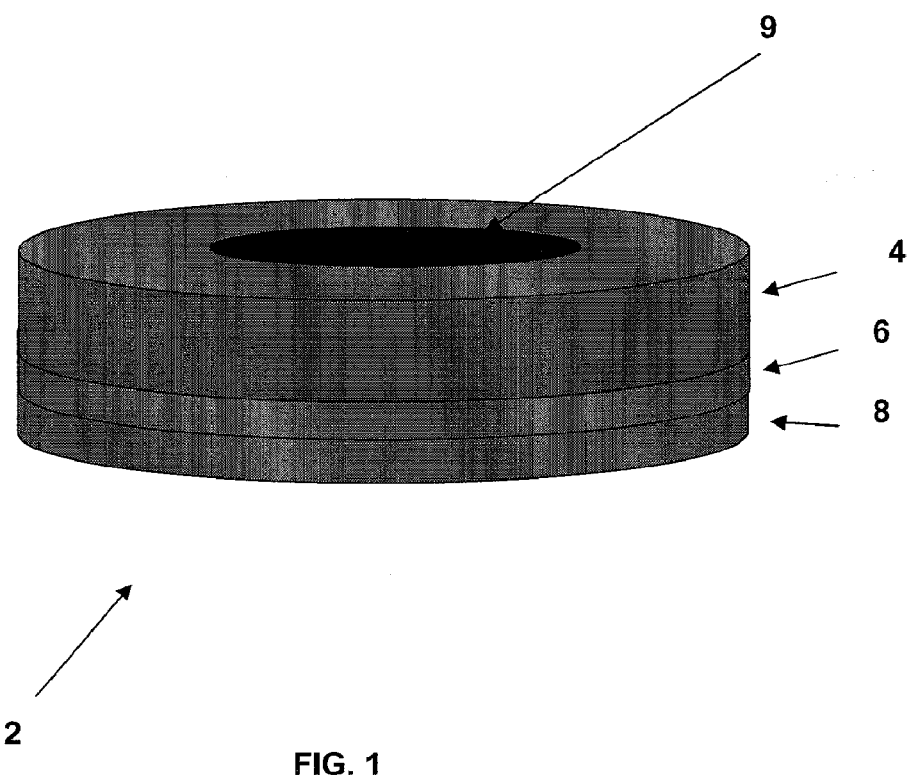
FIG. 1 is a schematic diagram illustrating the architecture of a single magnetic multilayer ring used in accordance with the invention.

The magnetoresistive response of lithographically-defined multilayered elements is of great current interest as these structures constitute the building blocks for a range of data storage and logic applications. FIG. 1 shows the basic architecture of a single magnetic multilayer ring structure 2 having two ferromagnetic layers 4, 8 (soft and hard) separated by a non-magnetic or insulator spacer 6. A vacant open region is positioned in the center region of said magnetic ring structure.

The ring structure 2 has dimensions comprising a length L and breadth smaller than L, comprising an elliptical arrangement, however, other ring structures having designs such as circular, or rings with corners can be used. The value of L can be in the range of 50 nm to 5 μm and width of the ring structure can be 10-500 nm. In other embodiments of the invention, a layer of gold (Au) or other material can also be deposited on the topmost layer of the multilayer ring structure 2 to reduce corrosion or improve electrical contact. The ring may also comprise an antiferromagnetic layer adjacent to the hard magnetic layer to pin the magnetization of the hard magnetic layer, or other layers such as a synthetic antiferromagnet to reduce magnetostatic interactions between the magnetic layers.

By designing the ring shape, which can be circular, elliptical, or with corners, one can control the switching behavior and therefore the number of distinct magnetic states that the ring can adopt, and the field required to switch between them. For example, a rhombic shaped ring has an extensive stability range of certain magnetic configurations that include 360° domain walls, and the formation of these states can occur at low applied fields, below 100 Oe. The ring may be set into particular magnetization states by application of a magnetic field, or by the action of an electric current that causes current-induced reversal of the ring.

Figure 2A:
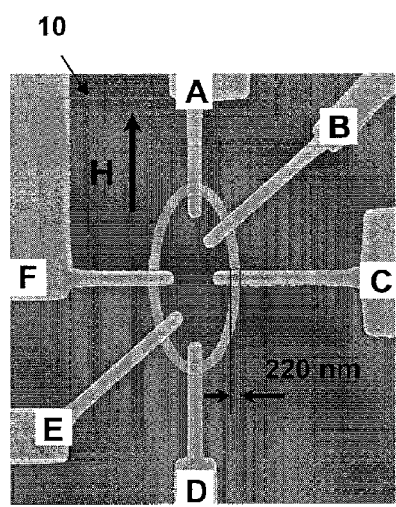
FIG. 2A is a scanning electron micrograph (SEM) corresponding to the single magnetic multilayer ring used in accordance with the invention.
Figure 2B:
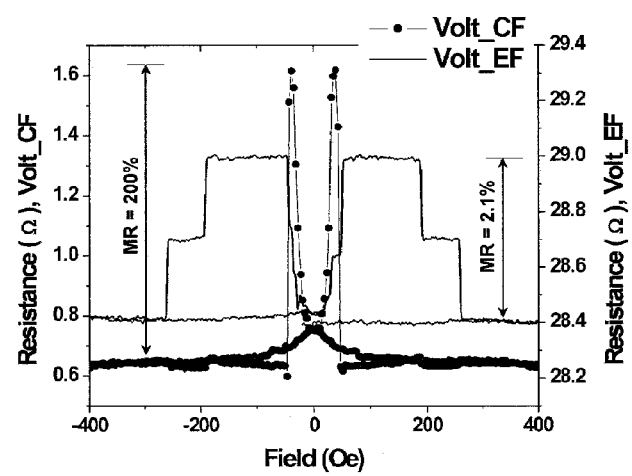
FIG. 2B shows magnetoresistance curves measured using an asymmetric (non-WB) contact configuration and a symmetric or Wheatstone-bridge (WB) configuration.

FIG. 2A shows a scanning electron micrograph (SEM) corresponding to a 4 μm-long, 220 nm-wide, WB arrangement 10 having a multilayer structure comprising NiFe (6 nm)/Cu (5 nm)/Co (5 nm)/Au (4 nm). In particular, FIG. 2A represents a current-in-plane (CIP) giant magnetoresistive device. FIG. 2B illustrates magnetoresistance curves measured using first, an asymmetric contact configuration having current contacts A-D and voltage contacts E-F, and second, a symmetric or WB configuration having current contacts A-D and voltage contacts C-F, with the contacts labelled as shown in FIG. 2A. Importantly, in the device of FIG. 2A measured using the asymmetric contact configuration, the total resistance change is modest and is typically limited to a few percent, which restricts the signal-to-noise ratio and thus the usefulness of the device. However, for the WB contact configuration, the same device produces a much greater proportional change in resistance. While the maximum relative resistance change for the asymmetric contact arrangement is 2.1% (right hand axis), the WB contact arrangement provides a lower resistance and relative resistance change of 26% (left hand axis).

The WB arrangement 10 therefore allows much larger resistance changes to be obtained for rings made out of the multilayer, compared with the asymmetric contact configuration. Other multilayer structures could also be used, for example, those with exchange bias or synthetic antiferromagnetic layer sequences.

The WB arrangement 10 provides the advantage that very large signals are obtained from the ring, 100 times or greater than the inherent magnetoresistance of the multilayer which is typically a few percent. Therefore the WB arrangement 10 allows a current-in-plane geometry to be used and still obtain a large signal. The current-in-plane (CIP) geometry is easier to fabricate than current-perpendicular-to-plane (CPP) devices, and the WB arrangement 10 allows large signals to be produced, for example, as large or greater than the resistance changes observed in magnetic tunnel junction devices.

When the ring is in a highly symmetrical magnetic state, for example, at remanence after saturation, the voltage CF is very small, but as the soft NiFe layer begins to reverse under the influence of a small applied field, the 'bridge' becomes unbalanced and a voltage CF develops. Depending on the placement of the contacts in the WB, and the ring geometry, relative resistance changes between 25% and as high as 185% have been measured in such structures, despite the giant magnetoresistance of the film itself being only 2%. The resistance shows several distinct levels which have been identified as resulting from magnetic configurations containing different combinations of 180 degree and 360 degree domain walls in the hard and soft layers. The use of this structure in magnetoelectronic devices could provide high signal amplitude even for a CIP geometry, which is easier to fabricate than a current-perpendicular-to-plane geometry.

The magnetic multilayer stack NiFe (6 nm)/Cu (4 nm)/Co (4 nm)/Au (4 nm) was deposited using DC-triode sputtering and the ring pattern was defined by electron-beam lithography, for example a ring with 4 μm length, 2 μm breadth and a 220 nm width as shown in FIG. 2A. The final electrical contacts A, B, C, D, E, F comprised Ta (3 nm)/Cu (110 nm)/Au (8 nm). The four point probe measurement technique used an AC (10 μA r.m.s., 1 kHz) current source with lock-in detection to measure the resistance of the ring while a varying magnetic field was applied.

Figure 3A:
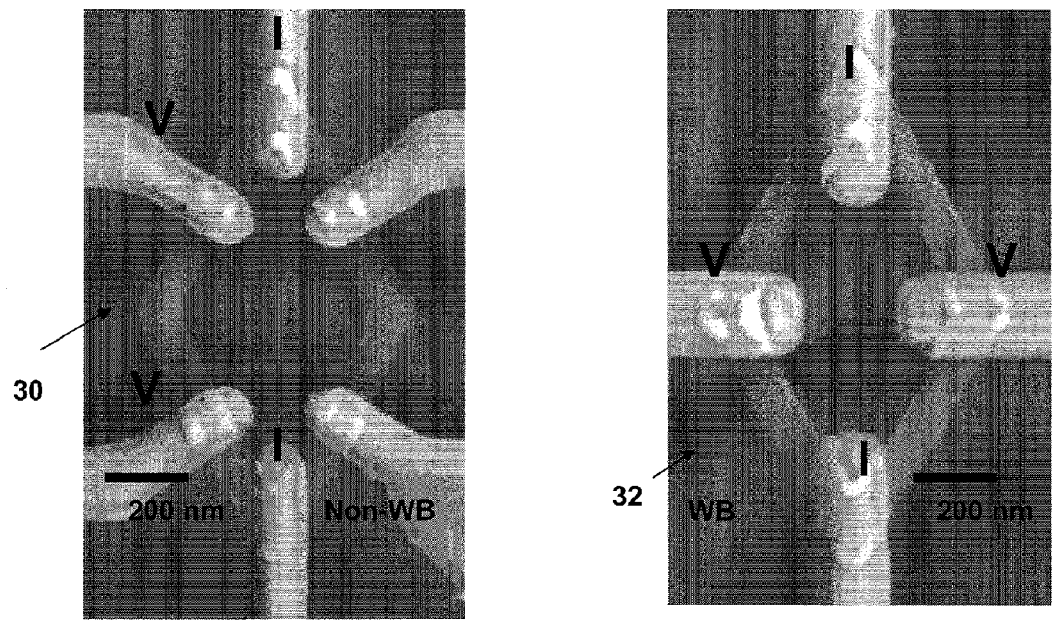
FIG. 3A shows SEM images of a non-WB ring structure and WB ring structure.

FIG. 3A shows an asymmetrically contacted ring structure 30 and a WB-contacted ring structure 32 and their respective current contacts (I) and voltage contacts (V). The ring structures used in FIG. 3A are rhombic in shape. A rhombic shaped ring has an extensive stability range of certain magnetic configurations that include 360° walls, and the formation of these states can occur at low applied fields.

Figure 3B:
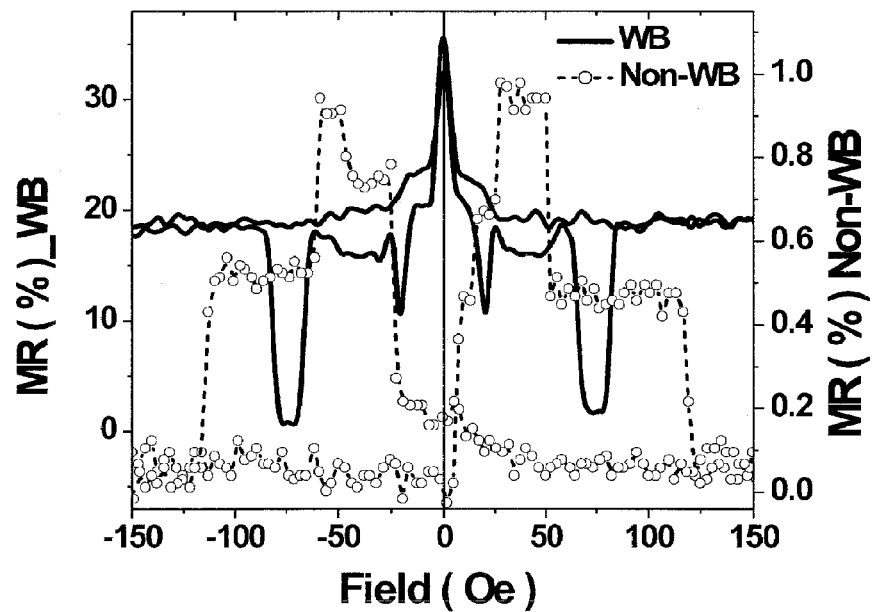
FIG. 3B are graphs comparing the resistance vs. applied field of the WB ring structure and the non-WB ring structure.

FIG. 3B compares the resistance vs. applied field for the WB ring structure 32 and the asymmetric ring structure 30. Each plot shows various resistance levels at different fields. The different resistance levels could represent data bits in a memory or logic device. What is important is that the resistance difference between these levels is quite small for the asymmetrically contacted ring structure 30 (right hand axis, about 1% difference) but for the WB ring structure 32, changes of 35% (left hand axis) are seen. The much greater resistance difference makes the device easier to 'read'.

Figure 4A:
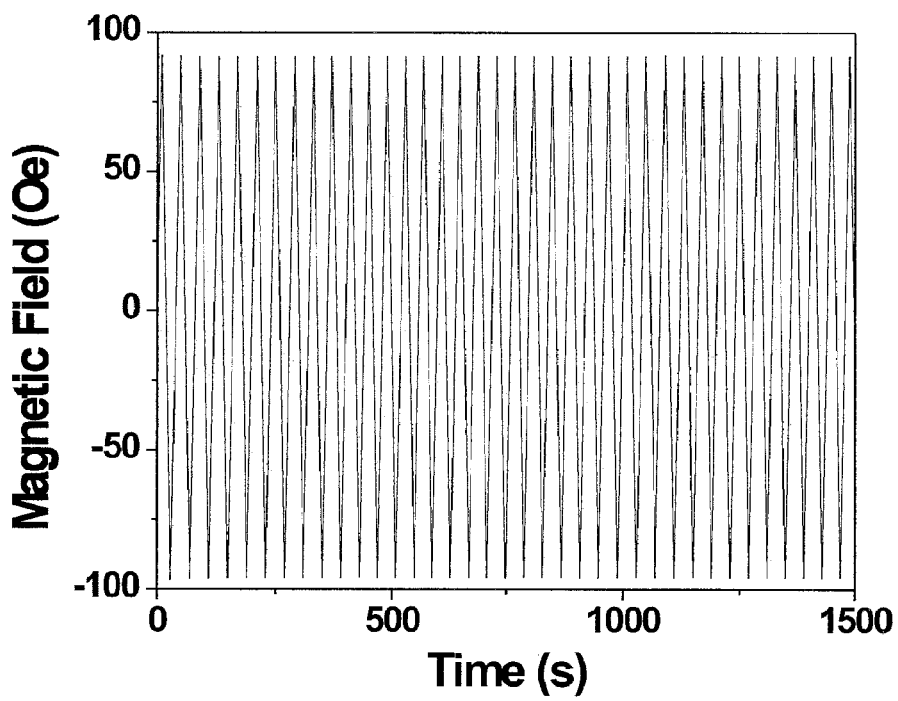
FIG. 4A is a graph illustrating a WB ring structure being cycled multiple times by an applied field.
Figure 4B:
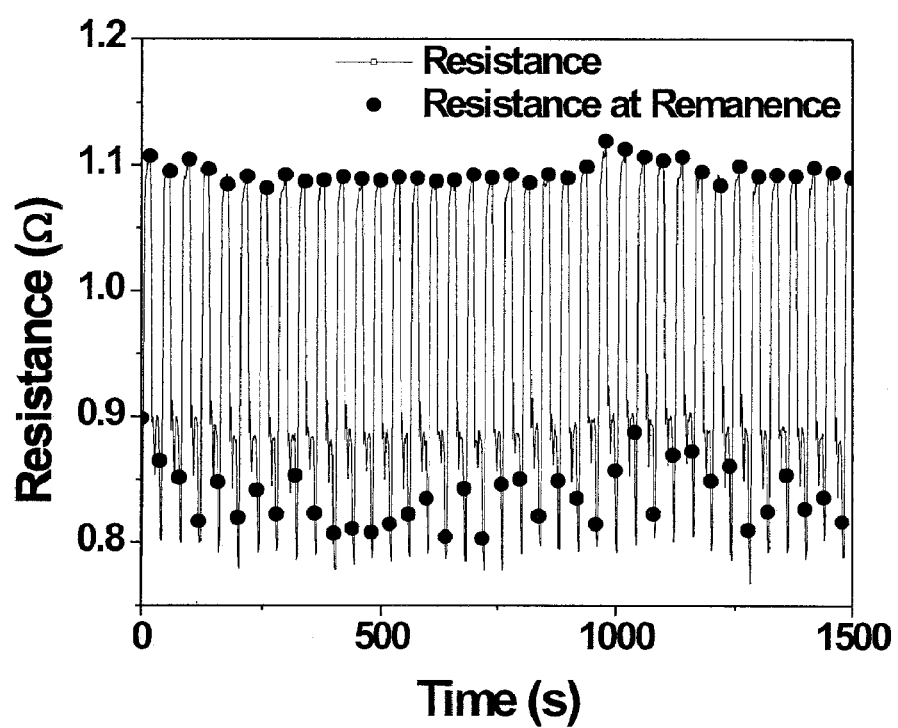
FIG. 4B is a graph illustrating the resulting resistance being reproducible.

Moreover, a WB ring structure device can be cycled multiple times by an applied field that varies with time, as shown in FIG. 4A, and the resulting resistance changes are quite reproducible as shown in FIG. 4B.

Figure 5:
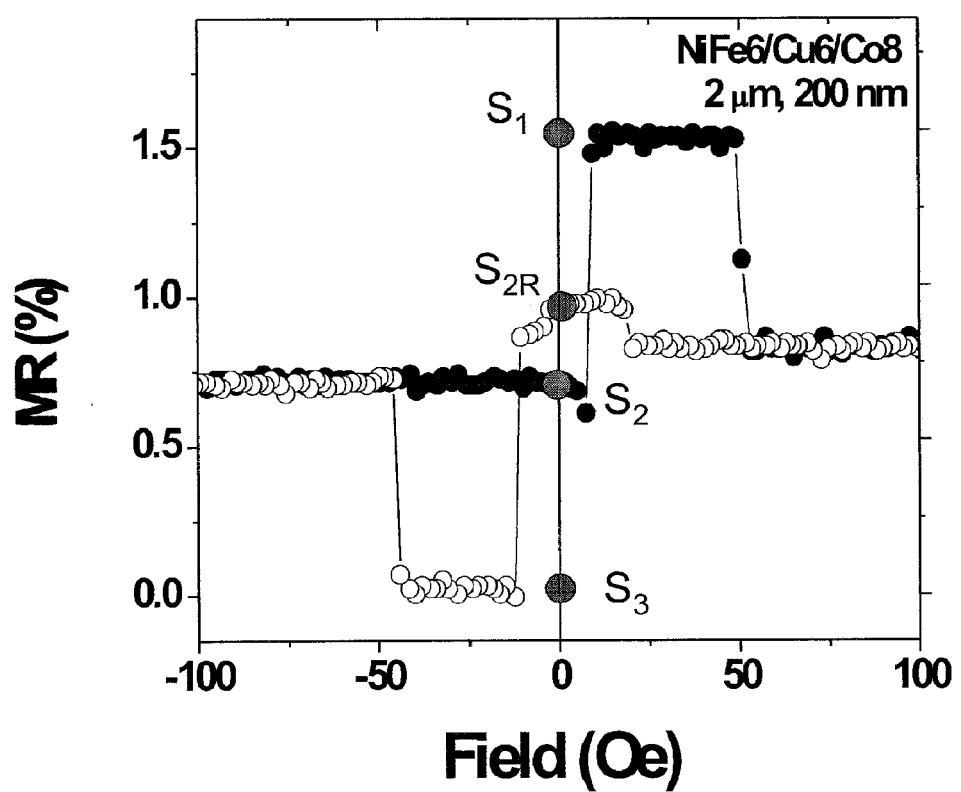
FIG. 5 is a graph illustrating the states of a nonvolatile memory element using the inventive ring structure.

The invention can be applied in a nonvolatile multi-bit memory element, using the multiple resistance levels obtained by low-field cycling. FIG. 5 shows results from the low-field cycling of a ring structure having a multilayer arrangement of NiFe (6 nm)/Cu (5 nm)/Co (5 nm) and a length of 2 μm and width of 200 nm. This cycling can produce four different remanent states (S1, S2, S2R, and S3) which can represent two bits, as shown in FIG. 5. A different field cycling enables additional states to be accessed. This ring structure can be used as the data storage element of a magnetic random access memory. It may also be used as a logic gate, in which the ring would first be set into a desired configuration which defines its function, then two inputs are applied (e.g. two magnetic fields, or two currents) and the output (the resistance) is measured. The output will be a logical combination of the two inputs.

Although the present invention has been shown and described with respect to several preferred embodiments thereof, various changes, omissions and additions to the form and detail thereof, may be made therein, without departing from the spirit and scope of the invention.

What is claimed is:

1. A magnetoresistive ring structure comprising:
 a first magnetic layer comprising a ferromagnetic material;
 a second magnetic layer comprising a ferromagnetic material;
 a non-magnetic spacer positioned between said first magnetic layer and said second magnetic layer;
 a vacant open region positioned in the center region of said magnetoresistive ring structure; wherein a plurality of magnetic states may exist in either said first magnetic layer or second magnetic layer; and
 at least four different remanent states enabled from field cycling of said magnetoresistive ring structure.

2. The magnetoresistive ring structure of claim 1, wherein said first magnetic layer comprises Co, Ni, Fe, NiFe or alloys thereof.

3. The magnetoresistive ring structure of claim 1, wherein said second magnetic layer comprises Co, Ni, Fe, NiFe or alloys thereof.

4. The magnetoresistive ring structure of claim 1, wherein said a non-magnetic spacer comprises Cu.

5. The magnetoresistive ring structure of claim 1 further comprising a layer of Au deposited on its upper surface.

6. The magnetoresistive ring structure of claim 1, wherein said magnetic states comprise different combinations of 180 degree and 360 degree domain walls.

7. A magnetoresistive Wheatstone-bridge structure comprising:
 a magnetoresistive ring structure comprising:
  a first magnetic layer comprising a ferromagnetic material;

a second magnetic layer comprising a ferromagnetic material;

a non-magnetic spacer positioned between said first magnetic layer and said second magnetic layer; and a vacant open region positioned in the center region of said magnetoresistive ring structure; wherein a plurality of magnetic states may exist in either said first magnetic layer or second magnetic layer;

a wheatstone bridge configuration comprising a plurality of voltage and current contacts arranged upon said magnetoresistive ring structure; and at least four different remanent states enabled from field cycling of said magnetoresistive ring structure.

8. The magnetoresistive Wheatstone-bridge structure of claim 7, wherein said first magnetic layer comprises Co, Ni, Fe, NiFe or alloys thereof.

9. The magnetoresistive Wheatstone-bridge structure of claim 7, wherein said second magnetic layer comprises Co, Ni, Fe, NiFe or alloys thereof.

10. The magnetoresistive Wheatstone-bridge structure of claim 7, wherein said a non-magnetic spacer comprises Cu.

11. The magnetoresistive Wheatstone-bridge structure of claim 7 further comprising a layer of Au deposited on its upper surface.

12. The magnetoresistive Wheatstone-bridge structure of claim 7, wherein said magnetic states comprise different combinations of 180 degree and 360 degree domain walls.

13. A method of forming a magnetoresistive ring structure comprising:

forming a first magnetic layer comprising a ferromagnetic material;

forming a second magnetic layer comprising a ferromagnetic material;

forming a non-magnetic spacer positioned between said first magnetic layer and said second magnetic layer;

forming a vacant open region positioned in the center region of said magnetoresistive ring structure; wherein a plurality of magnetic states may exist in either said first magnetic layer or second magnetic layer; and applying field cycling to said magnetoresistive ring structure to enable at least four different remanent states.

14. The method of claim 13, wherein said first layer comprises Co, Ni, Fe, NiFe or alloys thereof.

15. The method of claim 13, wherein said second magnetic layer comprises Co, Ni, Fe, NiFe or alloys thereof.

16. The method of claim 13, wherein said a non-magnetic spacer comprises Cu.

17. The method of claim 13, further comprising a layer of Au deposited on its upper surface.

18. The method of claim 13, wherein said magnetic states comprise different combinations of 180 degree and 360 degree domain walls.

* * * * *